United States Patent
Kinose et al.

(12)

(10) Patent No.: US 6,395,807 B1
(45) Date of Patent: May 28, 2002

(54) FINE SPHERICAL SILICA AND LIQUID SEALING RESIN COMPOSITION CONTAINING SAME

(75) Inventors: Yutaka Kinose; Shinsuke Miyabe; Takeshi Sakamoto, all of Tokyo (JP)

(73) Assignee: Nippon Chemical Industrial Co., LTD, Tokyo (JP)

( * ) Notice: Subject to any disclaimer, the term of this patent is extended or adjusted under 35 U.S.C. 154(b) by 0 days.

(21) Appl. No.: 09/547,406

(22) Filed: Apr. 11, 2000

(51) Int. Cl.$^7$ ................................................ C08L 63/00

(52) U.S. Cl. ........................ 523/443; 423/335; 423/336; 423/337; 423/338; 423/339; 524/492; 524/493

(58) Field of Search .................................. 523/440, 443; 524/492, 493, 789; 502/233, 234; 423/335, 336, 337, 338, 339; 436/527; 106/287.34, 481, 482, 490, 494

(56) References Cited

FOREIGN PATENT DOCUMENTS

JP           200063630        *  2/2000

* cited by examiner

*Primary Examiner*—Robert Dawson
*Assistant Examiner*—D. Aylward
(74) *Attorney, Agent, or Firm*—Armstrong, Westerman, Hattori, McLeland & Naughton, LLP

(57) ABSTRACT

The fine spherical silica having a particle size distribution in which maximum particle diameter is 24 μm, average particle diameter is 1.7 to 7 μm, and the proportion $X_1$ of particles having a particle diameter of 3 μm or less in the total particles is $100/D_{50}$ to $(18+100/D_{50})$ wt %, and the viscosity at 50° C. of a mixture obtained by blending a maximum of 80 wt % of the fine spherical silica with a liquid epoxy resin or silicone resin at room temperature is 20 Pa·s or less is provided. The spherical silica is useful as a filler for sealing resin composition which has excellent gap permeability and seals slight gaps, between a substrate and an IC chip and has high reliability.

4 Claims, 1 Drawing Sheet

FINE SPHERICAL SILICA AND LIQUID SEALING RESIN COMPOSITION CONTAINING SAME

BACKGROUND OF THE INVENTION

1. Field of the Invention

The present invention relates to a fine spherical silica having excellent viscosity characteristics and a liquid sealing resin composition for sealing slight gaps between a substrate and an IC chip.

2. Description of Related Art

Demand for high performance and functionality in electronic equipment is increasing with the advent of the multimedia age. In view of this, the shape of IC packages used in electronic equipment tends to be small, thin and of a multiple pin structure. Semiconductor chips are molded by sealing the entire IC chip with an sealant in order to protect fine and complicated electronic circuits formed on the surface thereof from dust or moisture in the air. At present, the material that is most commonly used as an sealant for semiconductor IC chip, is an epoxy resin sealant. This epoxy resin sealant is roughly classified into an epoxy resin sealant for transfer molding and a liquid epoxy resin sealant. The sealant mainly used at present is the epoxy resin sealant for transfer molding, and the use of liquid epoxy resin sealant has heretofore been limited.

However, recently this liquid epoxy resin sealant is beginning to be used as an sealant for the most advanced semiconductor devices, for example, P-PGA (Plastic Pin Grid Array), P-BGA (Plastic Ball Grid Array), flip chip or CSP (Chip Size Package or Chip Scale Package). Of these, many CSPs have a smaller and more complicated structure than conventional devices. The gaps between a substrate and an IC chip in CSPs have been conventionally about 75 to 100 μm. However, in recent years, bump size has become small due to the narrow pitch resulting from a multiple pitch structure, and devices having gaps of about 30 to 50 μm are becoming more common. Further, in the most advanced semiconductor devices, devices having a gap size of 1 mil (25.4 μm) are being developed.

In order to seal these very advanced semiconductor devices, a fine process-ability is required, and as a sealant which can meet this requirement, there has been a demand for development of a liquid epoxy resin sealant having excellent gap permeability.

On the other hand, the conventional liquid epoxy resin sealants have a problem in that stress generated due to difference between the coefficients of linear expansion of the liquid sealant and an IC chip need to be reduced in order to increase the reliability of the sealant. As a method for solving this problem, there is a method of decreasing the coefficient of linear expansion by blending a large amount of silica filler in the liquid epoxy resin sealant, and as a method for solving the problem of fluidity due to this blend of large amount of silica filler, many methods have been proposed in which finely fused spherical silica having excellent low viscosity characteristics is used (for example, Japanese Patent Application Laid-open Nos. Hei 2-59416, and Hei 2-199013).

However, it is difficult to say that conventional liquid epoxy resin sealants have high reliability together with the capability of holding a large amount of silica filler, as well as sufficient gap permeability for sealing slight gaps between a substrate and an IC chip in the most advanced semiconductor devices. For this reason, there has been a demand for development of a liquid epoxy resin sealant having high reliability together with the capability of holding a large amount of silica filler as well as excellent gap permeability, and a silica for a liquid sealant, which imparts this performance from the silica filler side.

Accordingly, an object of the present invention is to provide a liquid sealing resin composition having excellent gap permeability for sealing slight gaps between a substrate and an IC chip and also having high reliability, and a fine spherical silica filler to be filled therein.

SUMMARY OF THE INVENTION

In view of the above, the inventors of the present invention have made extensive investigations, and found that the above conventional problems can be overcome, and excellent gap permeability for sealing slight gaps between a substrate and an IC chip and high reliability can be obtained, if fused spherical silica having specific particle size characteristics and viscosity characteristics, for example, a fine spherical silica obtained by mixing fine particles with relatively large particles in a specific proportion, is blended with an epoxy resin or silicone resin which is liquid at room temperature. The present invention has been completed based on this finding.

That is, the present invention provides a fine spherical silica having a particle size distribution in which a maximum particle diameter is 24 μm, an average particle diameter is 1.7 to 7 μm, and a proportion $X_1$ of particles having a particle diameter of 3 μm or less in the total particles is in a range from $100/D_{50}$ wt % to $(18+100/D_{50})$ wt %, characterized in that viscosity at 50° C. of a mixture obtained by blending a maximum of 80 wt % in terms of the total weight amount of the fine spherical silica with epoxy resin or silicone resin which is liquid at room temperature is 20 Pa·s or less.

Further, the present invention provides a fine spherical silica, characterized by comprising a mixture of (A) fused spherical silica having a particle size distribution in which a maximum particle diameter is 24 μm, an average particle diameter is 2 to 7 μm and a proportion of particles having a particle diameter of 1 μm or less in the total particles is 1 wt % or less, and having a BET specific surface area of 3 m²/g or less, and (B) spherical silica having a maximum particle diameter of 10 μm, an average particle diameter of 0.3 to 1.0 μm and a BET specific surface area of 6 to 15 m²/g, the weight ratio of (A)/(B) being in a range of 99/1 to 40/60.

Still further, the present invention provides a liquid sealing resin composition comprising an epoxy resin or silicone resin which is liquid at room temperature and 30 to 80 wt % of the fine spherical silica blended therewith.

Even if the fine spherical silica filler for a liquid sealant of the present invention is blended in large proportion with an epoxy resin or silicone resin, which is liquid at room temperature, the viscosity is not lowered and the coefficient of linear expansion of the liquid sealing resin composition can be minimized. Therefore, the fine spherical silica filler can impart high reliability. Further, even if the fine spherical silica filler is blended in large proportions, the resulting liquid sealing resin composition has low viscosity, and therefore, good gap permeability.

BRIEF DESCRIPTION OF THE DRAWINGS

In FIG. 1, 1 denotes a measurement sample, 2 denotes cover glass, 3 denotes groove of 30 μm deep, 4 denotes groove of 50 μm deep and 10 denotes a mold.

DETAILED DESCRIPTION OF THE INVENTION

Figure 1:
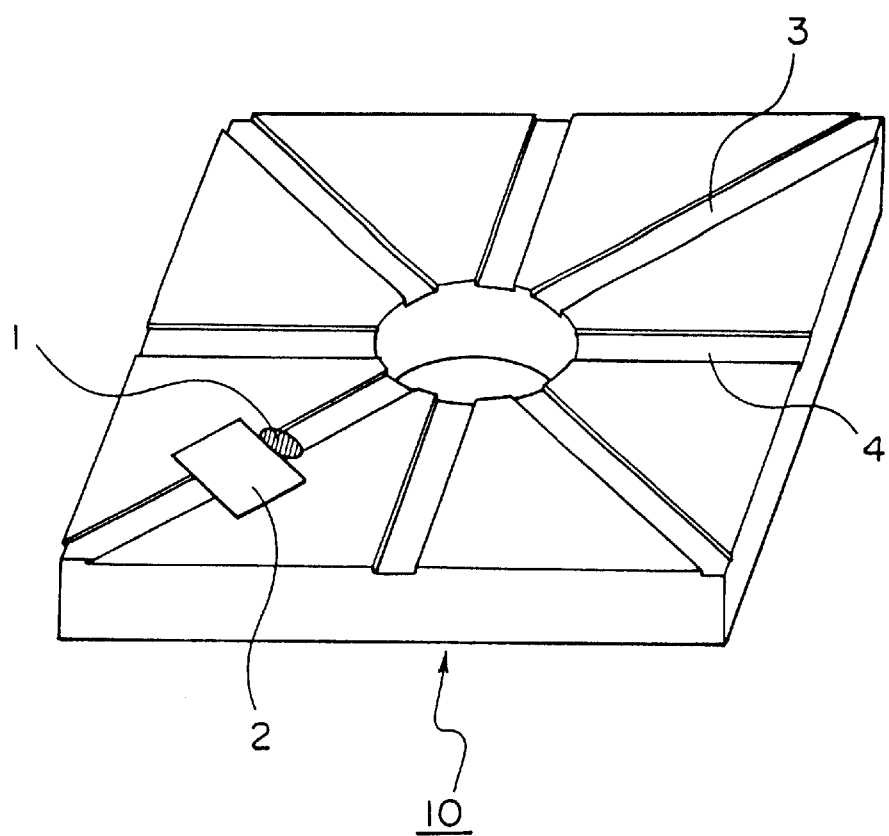
FIG. 1 is a perspective view showing a mold for evaluating gap permeability.

A fine spherical silica according to a first aspect of the present invention is specified by particle size characteristics and viscosity characteristics.

The particle size characteristics of the fine spherical silica comprise a particle size distribution in which a maximum particle diameter is 24 μm, an average particle diameter is 1.7 to 7 μm, and a proportion $X_1$ of particles having a particle diameter of 3 μm or less in the total particles is in a range from $100/D_{50}$ wt % to $(18+100/D_{50})$ wt %. The proportion $X_1$ of particles having a particle diameter of 3 μm or less in the total particles is influenced by the average particle diameter $D_{50}$ of the particles. For example, when the fine spherical silica has an average particle diameter of 3 μm, the proportion $X_1$ is 100/3=33.3 wt % or more, and 18+33.3=51.3 wt % or less; when the fine spherical silica has an average particle diameter of 5 μm, the proportion $X_1$ is 100/5=20 wt % or more, and 18+20=38 wt % or less; and when the fine spherical silica has an average particle diameter of 7 μm, the proportion $X_1$ is 100/7=14.3 wt % or more, and 18+14.3=32.3 wt % or less. That is, the fine spherical silica of the present invention has the particle size characteristics in the range of the average particle diameter of 1.7 to 7 μsuch that particles having a relatively large average particle diameter contain a small amount of the fine particles having a particle diameter of 3 μm or less, and particles having a small average particle diameter contain a large amount of the fine particles having a particle diameter of 3 μm or less.

Thus, when the fine spherical silica in which the maximum particle diameter, the average particle diameter and the proportion $X_1$ of the particles having a particle diameter of 3 μm or less in the total particles falling within the above specified ranges is used to form a liquid sealing resin composition, although the functioning mechanism is not clear, the viscosity of the composition decreases due to, for example, formation of very densely filled structure in a fluid by the interaction of relatively large particles and fine particles, or by solid lubricant action in which fine particles slidably move among large particles. Measurement of these maximum particle diameters, average particle diameters and particle size distributions can be conducted using a laser type microtrack particle diameter analyzer or the like.

The preferable range of particle size characteristics of the fine spherical silica is such that the maximum particle diameter is 24 μm, the average particle diameter is 2 to 7 μm and the proportion $X_1$ of particles having a particle diameter of 3 μm or less in the total particles is in a range from $100/D_{50}$ wt % to $(18+100/D_{50})$ wt %. By specifying the maximum particle diameter of the fine spherical silica to be 24 μm or less, where a liquid sealing resin composition is formed, the liquid sealing resin composition can sufficiently permeate the gaps between a substrate and an IC chip in a CSP. If the average particle diameter of the fine spherical silica exceeds 7 μm, making the maximum particle diameter 24 μm or less is generally difficult. Further, if the average particle diameter is less than 1.7 μm, the proportion of the particles having a particle diameter of 3 μm or less in the total particle diameter distribution is too large. As a result, viscosity is high when the liquid sealing resin composition is formed, and as a result, gap permeability becomes poor. Further, if the proportion of the particles having a particle diameter of 3 μm or less in the total particle size distribution of the fine spherical silica of the present invention falls outside the above range, the increase in the viscosity of the liquid sealant becomes large rapidly, and the gap permeability becomes poor.

Further, the viscosity characteristics of the fine spherical silica are such that viscosity at 50° C. of a mixture obtained by blending a maximum of 80 wt % of the fine spherical silica having the above particle size characteristics with an epoxy resin or silicone resin that is liquid at room temperature is 20 Pa·s or less, and preferably 18 Pa·s or less. Since the blended fine spherical silica has the above particle size characteristics, the fine spherical silica mixture for liquid sealant shows low viscosity even if blended in a large amount of 80 wt % by. Further, the viscosity characteristics of the fine spherical silica when expressed by viscosity at 50° C. of a mixture obtained by blending 70 wt % of the fine spherical silica having the above particle size characteristic with an epoxy resin or silicone resin that is liquid at room temperature, is 10 Pa·s or less, and preferably 8 Pa·s or less. The measurement of this viscosity can be conducted using ELD type rotational viscometer.

The epoxy resin that is liquid at room temperature used in the present invention is not particularly limited so long as it is a liquid epoxy resin having at least one epoxy group per molecule. Examples of the liquid epoxy resin include liquid phenol novolak type epoxy resins, liquid cresol novolak type epoxy resins, liquid bisphenol A type epoxy resins, liquid bisphenol AD type epoxy resins, liquid bisphenol F type epoxy resins, liquid alicyclic epoxy resins, and glycidyl ethers of 1,1-bis(4-hydroxyphenyl)ethane. Those epoxy resins that are liquid at room temperature can be used alone or as mixtures of two or more thereof.

The silicone resin that is liquid at room temperature used in the present invention is a polysiloxane represented by, for example, the following formula (1):

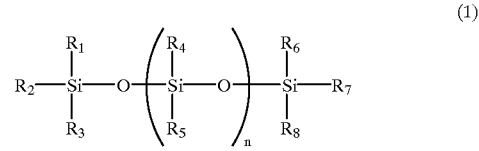

(1)

wherein n is 2 to 10,000, $R^1$ to $R^8$ are mainly a methyl group which may be substituted with a hydrogen atom, methyl group, phenyl group, higher fatty acid residue, epoxy-containing group or polyoxyalkylene group, and $R^4$ and $R^5$ may form a cyclic polysiloxane of a methylene group. The polysiloxanes include linear, cyclic, partially hydrogenated, or modified polysiloxanes having a viscosity at 25° C. of 2 to 100 Pa·s (1,000 poise), and preferably 2 to 500 Pa·s (500 poise) which are liquid in normal temperature. Examples of the polysiloxane include polydimethylsiloxane oil having a viscosity at 25° C. of 60 poise, polydimethylsiloxane oil having a viscosity at 25° C. of 500 poise, polydimethylsiloxane having a hydroxyl group at the terminals thereof, and polysiloxane having a vinyl group at the terminals thereof.

Further, the above characteristics of the fine spherical silica of the present invention are obtained by blending (A) fused spherical silica having a particle size distribution in which a maximum particle diameter is 24 μm, an average particle diameter is 2 to 7 μm and a proportion of particles having a particle diameter of 1 μm or less of the total particles is 1 wt % or less, and having a BET specific surface area of 3 m²/g or less, and (B) spherical silica having a maximum particle diameter of 10 μm, an average particle diameter of 0.3 to 1.0 μm and a BET specific surface area of 6 to 15 m²/g, with the weight ratio of (A)/(B) in a range of 99/1 to 40/60. In other words, a fine spherical silica according to a second aspect of the present invention is a mixture of relatively large particles and fine particles, and contains the fine particles in a slightly larger proportion.

A preferred aspect of the fused spherical silica of component (A) is that the maximum particle diameter is 24 $\mu$m, the average particle diameter is 2 to 7 $\mu$m, and preferably 3.3 to 6.6 $\mu$m, and the proportion of the particles having a particle diameter of 1 $\mu$m or less is 0.96 wt % or less in the total particles. By specifying the maximum particle diameter to be 24 $\mu$m or less, where a liquid sealing resin composition is formed, the composition can sufficiently permeate the gaps between a substrate and an IC chip in a CSP. If the average particle diameter exceeds 7 $\mu$m, making the maximum particle diameter 24 $\mu$m or less is difficult even by classification means. Further, if the average particle diameter is less than 2 $\mu$m, the proportion of the particles having a particle diameter of 3 $\mu$m or less in the total particle size distribution is too large even after mixing with the component (B). As a result, the viscosity is high when the liquid sealing resin composition is formed, and as a result, the gap permeability becomes poor. Further, if the proportion of the particles having a particle diameter of 1 $\mu$m or less in the total particle size distribution of the fused spherical silica exceeds 1%, the viscosity of the liquid sealant rapidly increases after blending the component (B), and as a result, the gap permeability becomes poor.

A method of obtaining the fused spherical silica of the component (A) is not particularly limited, but a preferred method is comprised of preparing high purity silica gel synthesized by a wet reaction between alkali silicate and mineral acid, grinding this high purity silica gel with a grinding machine, such as a ball mill or a jet mill, to thereby obtain ground silica gel having an average particle diameter of, for example, 5 $\mu$m, supplying this ground silica gel to a melting furnace to melt same at the melting point of the silica or more in an oxygen-LPG mixed flame, quenching the molten silica, and collecting the silica with a cyclone to obtain fused spherical silica. If necessary, this fused spherical silica is subjected to classification treatment to obtain fused spherical silica having particle size characteristics in the above range.

A preferred embodiment of the spherical silica of component (B) is such that the maximum particle diameter is 10 $\mu$m, preferably 8.5 $\mu$m, the average particle diameter is 0.3 to 1.0 $\mu$m, preferably 0.4 to 1.0 $\mu$m, and the BET specific surface area is 6.0 to 15 m$^2$/g, preferably 6.0 to 12.0 m$^2$/g. If the average particle diameter is less than 0.3 $\mu$m, the viscosity reducing effect after mixing with the fused spherical silica (A) is lost, and further, a powder having strong aggregation property is formed, causing a problem of uniformity in powder mixing. If the specific surface area is more than 15 m$^2$/g, the viscosity is high when mixed with a liquid resin, which is not practical. Thus, if the maximum particle diameter, average particle diameter and BET specific surface area of the spherical silica of component (B) fall outside the above ranges, when such a spherical silica is blended with the fused spherical silica of component (A) and a liquid sealing resin composition is then formed, the viscosity increase of the resulting composition is large and its gap permeability becomes poor.

The spherical silica of component (B) is not particularly limited, and examples of the spherical silica used in the present invention include fused spherical silica obtained by flame melting of silicone powder, fused spherical silica obtained by flame melting silica at a temperature of at least the melting point thereof to form SiO and then oxidizing the SiO by air oxidation to form SiO$_2$, and spherical silica obtained by a method such as hydrolysis of ethylene silicate.

The mixing ratio of the fused spherical silica (A) and the spherical silica (B) is such that (A)/(B) is 99/1 to 40/60, preferably 97/3 to 50/50, more preferably 95/5 to 60/40, further preferably 90/10 to 60/40, and still more preferably 90/10 to 70/30. Even if the mixing ratio of the fused spherical silica (A) exceeds 99 wt %, or the mixing ratio of the spherical silica (B) exceeds 60 wt %, the viscosity of the liquid sealant having same blended therewith is not lowered, but rather tends to increase, which is not preferable.

Silica fillers for sealants generally include spherical silica and crushed silica. Of these, when the crushed silica is blended with a liquid epoxy resin, the viscosity of the resulting composition is higher than when blending the spherical silica. Therefore, use of the crushed silica is not preferable in either of the component (A) or component (B).

The method of uniformly mixing the fused spherical silica (A) and the spherical silica (B) is not particularly limited. Examples include vessel rotational mixers such as a horizontal cylindrical type, a V-shaped or double conical type, and vessel fixed type mixers such as a ribbon type, a horizontal screw type, a paddle type, a vertical ribbon type, a malar type, a planetary movement type, a static mixer, a single screw rotor type, Henschel mixer or a flow jet mixer. These can be applied in either wet or dry methods, but the dry method is preferable.

The fine spherical silica of the present invention is preferably such that Na ion and Cl ion in boiling extraction water as ionic impurities are 1 ppm or less, respectively, and U and Th as radioactive impurities are 1 ppb or less, respectively. It is known that so-called software errors are caused when the amount of radioactive impurities is large, and particular care should be taken when it is used for encapsulation of semiconductor memory devices.

The liquid sealing resin composition of the present invention comprises an epoxy resin or silicone resin which is liquid at room temperature, and the above-described fine spherical silica blended therewith. The blending proportion of the fine spherical silica is 30 to 80 wt %, and preferably 30 to 75 wt %. Since the blended fine spherical silica has the above particle size characteristics, this liquid sealing resin composition shows low viscosity even though the fine spherical silica is blended in a large amount of 80 wt %. Examples of the epoxy resin and silicone resin which are liquid at room temperature include the same resins as described with the viscosity characteristics of the fine spherical silica.

The liquid sealing resin composition of the present invention can contain other optional components in addition to the fine spherical silica filler. Examples of the optional components include hardeners for epoxy resins, curing catalysts and coloring materials. Where the liquid resin is an epoxy resin, the optional components used include tertiary amines; aromatic hydroxyl group-containing tertiary amines such as 4-(imidazole-1-yl)phenol; cure accelerators such as diazobicyclo compounds; and hardeners such as phthalic anhydride, tetrahydrophthalic anhydride, hexahydrophthalic anhydride, methylhexahydrophthalic anhydride, methyltetrahydrophthalic anhydride and isophthalic anhydride.

Even if the fine spherical silica for a liquid sealant of the present invention is blended with the epoxy resin or silicone resin which is liquid at room temperature in a high proportion, the viscosity of the resulting composition does not increase, and the coefficient of linear expansion of the liquid sealing resin composition can be minimized. Therefore, the fine spherical silica has high reliability. Further, the fine spherical silica has a specific particle size distribution, and in such silica, the particles having a particle diameter of 3 $\mu$m or less are blended in a relatively large amount. Therefore, when a liquid resin composition is formed using such a fine spherical silica, a very densely filled structure is formed in a fluid by an interaction of relatively large particles and fine particles having a particle diameter of 3 $\mu$m or less, or viscosity is decreased by, for example, a solid lubricant action in which fine particles slidably move among large particles, whereby the liquid resin composition has good gap permeability. For this reason, the fine spherical silica for a liquid sealant of the present invention is suitably used as a filler for a sealant for a CSP having a narrow gap size of 24 μm.

EXAMPLES

The present invention is described in more detail with reference to the following Examples, but it should be understood that the invention is not limited thereto.

Reference Example

Production of Fused Spherical Silica (A)

3,300 g of hydrochloric acid aqueous solution (HCl: 11.2 wt %) was placed in a reactor equipped with a stirrer, and heated to 70° C. (1). Separately, 2,100 g of sodium silicate JIS No. 3 ($Na_2O$: 9.2 wt %, $SiO_2$: 28.5 wt %, $SiO_2/Na_2O$ molar ratio: 3.20) was placed in a vessel and stirred (2). 1.0 g of nitrile tetraacetic acid (NTA) dispersed in a small amount of water was added to the vessel (2) and dissolved. The resulting mixture was stirred at 70° C. for 2 hours. The NTA-containing sodium silicate aqueous solution thus obtained (2) was added to hydrochloric acid aqueous solution (1) over about 30 minutes, during this addition the temperature of the reactor being maintained at 70–80° C. After the addition, a reaction slurry was stirred and aged for 2 hours while stirring. Then, precipitates of silica were separated by filtration from the slurry after completion of the reaction. The precipitates of silica were washed by being repulped in water, and then separated again by filtration. The silica thus separated was placed in an acid treatment tank equipped with a stirrer, and water and hydrochloric acid were added to the tank for adjustment such that the total amount of slurry was 5 liters and the hydrochloric acid concentration in the slurry was 1N. Further, 17 g of 35% hydrogen peroxide was added to the tank, and the resulting silica slurry was subjected to acid treatment under heating at 70° C. for 2 hours while stirring. After completion of the treatment, silica was separated from the slurry by filtration, subjected to a repulping and washing with water in a conventional manner, and then calcined at 900° C. for 2 hours to obtain high purity silica gel. This high purity silica gel was ground with a ball mill and a jet mill to obtain high purity silica gel having an average particle diameter of 5 μm. This high purity silica gel was supplied to a melting furnace, and melted in oxygen-LPG mixed flame at a temperature of at least the melting point of silica. The fused silica was quenched and collected with a cyclone to obtain fused spherical silica. The fused spherical silica was subjected to classification treatment, if needed to obtain two kinds of fused spherical silica (I) and (II) having different particle size characteristics. Average particle diameter, maximum particle diameter, proportion of particles having a particle diameter of 1 μm or less and specific surface area of those silicas are shown in Table 1 below. The average particle diameter, maximum particle diameter and proportion of particles having a particle diameter of 1 μm or less were measured using a laser method microtrack particle diameter analyzer in the conventional manner. The specific surface area was measured using BET method monosorb specific surface area measurement device in the conventional manner. Spherical Silica (B):

Commercially available spherical silica (III) (trade name: ADMAFINE SO-25H, a product of Tatsumori Co.) was used. The particle size characteristics are shown in Table 1 below.

TABLE 1

| | Maximum particle diameter (μm) | Average particle diameter (μm) | Proportion of particles having particle diameter of 1 μm or less (%) | Specific surface area (m²/g) |
|---|---|---|---|---|
| Fused spherical silica (I) | 15.6 | 5.4 | 0.11 | 1.3 |
| Fused spherical silica (II) | 22.2 | 6.6 | 0.17 | 0.9 |
| Spherical silica (III) | 8.4 | 0.8 | — | 10.6 |

Examples 1 to 8 and Comparative Examples 1 and 2

Fused spherical silica (I) and fused spherical silica (III) obtained in the Reference Example were mixed in the mixing proportions shown in Table 2 to prepare various kinds of mixed fine spherical silicas. The results of the average particle diameter, proportion (wt %) of particles having a particle diameter of 3 μm or less, viscosity of a mixture prepared by mixing with an epoxy resin that is liquid at room temperature, and gap permeability are shown in Table 2. The viscosity (50° C.) and gas permeability were measured by the following methods. In Table 2, the expression "not permeated" shows 60 minutes or more. Viscosity at 50° C.:

12 g of an epoxy resin (trade name: EPIKOTE 815, a product of Yuka Shell Epoxy K. K.) having a viscosity at 25° C. of 0.98 Pa·s (9.8 poise) and 28 g of a fine spherical silica (blending amount: 70 wt %) were weighed and placed in a beaker made of polypropylene, and uniformly mixed with a glass rod. The viscosity of the resulting mixture was measured in a constant temperature bath at a predetermined temperature (50° C.) using an ELD type rotational viscometer (a product of Tohki Sangyo K. K.) in a conventional manner. Gap permeability:

A mold having grooves of 5 mm wide, 30 μm or 50 μm deep as shown in FIG. 1 was used. A cover glass of 18 mm long and 18 mm wide was put on grooves and heated to a temperature of 75° C. A measurement sample was placed on an end portion of the cover glass, and the time required to permeate up to the other end by capillary action was measured and expressed in "minutes". The measurement sample used was a mixture obtained by weighing 14 g of an epoxy resin (trade name: EPIKOTE 815, a product of Yuka Shell Epoxy K. K.) having a viscosity at 25° C. of 0.98 Pa·s and a viscosity at 50° C. of 0.12 Pa·s and 26 g of a fine spherical silica (silica blending ratio: 65 wt %), placing those in a beaker made of polypropylene, and uniformly mixing the mixture with a glass rod.

Examples 9 and 13 and Comparative Example 3

The fused spherical silica (II) and the spherical silica (III) obtained in the Reference Example were mixed in the mixing ratios shown in Table 3 to prepare various kinds of mixed fine spherical silica. The average particle diameter, proportion (wt %) of particles having a particle diameter of 3 μm or less, viscosity of a mixture prepared by mixing the silica with an epoxy resin that is liquid at room temperature, and gap permeability are shown in Table 3.

From Tables 1 to 3, it can be seen that the mixed product of the fused spherical silica (I) or (II) and the spherical silica (III) has a lower viscosity, when a liquid sealing resin composition was formed using same, than the composition in which a single silica was used. The tendency for the viscosity to decrease is remarkable in the range where the mixing ratio (fused spherical silica/spherical silica) is 95/5 to 50/50.

TABLE 2

|  | Fused spherical silica (I) | Fused spherical silica (III) | Average particle diameter $D_{50}$ (μm) | $X_1$ Proportion of particles having a particle diameter of 3 μm or less (wt %) | $100/D_{50}$ | $18 + 100/D_{50}$ | Viscosity (Pa·s) 5 rpm | Viscosity (Pa·s) 10 rpm | Gap permeability 30 μm Gap min | Gap permeability 50 μm Gap min |
|---|---|---|---|---|---|---|---|---|---|---|
| Comp. Ex. 1 | 100 | 0 | 5.4 | 17.3 | 18.5 | 36.5 | 8.3 | 8.3 | 20 or more | 4 |
| Ex. 1 | 95 | 5 | 5.2 | 20.0 | 19.6 | 37.6 | 5.4 | 5.9 | 20 | 4 |
| Ex. 2 | 90 | 10 | 5.1 | 21.6 | 19.6 | 37.6 | 4.7 | 4.9 | 18 | 5 |
| Ex. 3 | 85 | 15 | 5.1 | 22.5 | 19.6 | 37.6 | 5.1 | 5.2 | 18 | 5 |
| Ex. 4 | 80 | 20 | 5.0 | 23.9 | 20.0 | 38.0 | 4.1 | 4.0 | 18 | 5 |
| Ex. 5 | 70 | 30 | 4.8 | 28.2 | 20.8 | 38.8 | 4.8 | 4.6 | 18 | 5 |
| Ex. 6 | 60 | 40 | 4.8 | 28.4 | 20.8 | 38.8 | 4.8 | 4.6 | 18 | 5 |
| Ex. 7 | 50 | 50 | 4.3 | 37.5 | 23.3 | 41.3 | 5.5 | 5.0 | 18 | 5 |
| Ex. 8 | 40 | 60 | 3.5 | 46.2 | 28.6 | 46.6 | 7.8 | 7.8 | 17 | 7 |
| Comp. Ex. 2 | 0 | 100 | 1.0 | 100 | 100 | 118 | 50 or more | 50 or more | Not permeated | Not permeated |

TABLE 3

|  | Fused spherical silica (II) | Fused spherical silica (III) | Average particle diameter $D_{50}$ (μm) | $X_1$ Proportion of particles having a particle diameter of 3 μm or less (wt %) | $100/D_{50}$ | $18 + 100/D_{50}$ | Viscosity (Pa·s) 10 rpm | Gap permeability 30 μm Gap min | Gap permeability 50 μm Gap min |
|---|---|---|---|---|---|---|---|---|---|
| Comp. Ex. 3 | 100 | 0 | 6.6 | 14.6 | 15.2 | 33.2 | 8.2 | 20 or more | 3 |
| Ex. 9 | 95 | 5 | 6.6 | 17.9 | 15.1 | 33.1 | 5.0 | 20 or more | 3 |
| Ex. 10 | 90 | 10 | 6.5 | 19.1 | 15.4 | 33.4 | 4.4 | 20 or more | 3 |
| Ex. 11 | 80 | 20 | 6.4 | 22.7 | 15.6 | 33.6 | 3.8 | 20 or more | 3 |
| Ex. 12 | 70 | 30 | 6.1 | 27.2 | 16.4 | 34.4 | 4.5 | 20 or more | 3 |
| Ex. 13 | 60 | 40 | 5.8 | 32.4 | 17.2 | 35.2 | 5.0 | 20 | 4 |

What is claimed is:

1. A fine spherical silica having a particle size distribution in which a maximum particle diameter is 24 μm, an average particle diameter is 1.7 to 7 μm, and a proportion $X_1$ of particles having a particle diameter of 3 μm or less in the total particles is in a rage from $100/D_{50}$ wt % to $(18+100/D_{50})$ wt %, characterized in that viscosity at 50° C. of a mixture obtained by blending a maximum of 80 wt % in terms of the total weight amount of the fine spherical silica with an epoxy resin or silicone resin which is liquid at room temperature is 20 Pa·s or less.

2. A fine spherical silica, characterized by comprising a mixture of (A) fused spherical silica having a particle size distribution in which a maximum particle diameter is 24 μm, an average particle diameter is 2 to 7 μm and a proportion of particles having a particle diameter of 1 μm or less in the total particles is 1 wt % or less, and having a BET specific surface area of 3 m²/g or less, and (B) spherical silica having a maximum particle diameter of 10 μm, an average particle diameter of 0.3 to 1.0 μm and a BET specific surface area of 6 to 15 m²/g, the weight ratio of (A)/(B) being in a range of 99/1 to 40/60.

3. The fine spherical silica as claimed in claim 1 or 2, which is used as a silica filler for a liquid sealant.

4. A liquid sealing resin composition, characterized by blending an epoxy resin or silicone resin which is liquid at room temperature and 30 to 80 wt % in terms of the total weight amount of the fine spherical silica as claimed in claim 1 or 2 therewith.

* * * * *